United States Patent
Otremba

(10) Patent No.: US 7,274,092 B2
(45) Date of Patent: Sep. 25, 2007

(54) SEMICONDUCTOR COMPONENT AND METHOD OF ASSEMBLING THE SAME

(75) Inventor: Ralf Otremba, Kaufbeuren (DE)

(73) Assignee: Infineon Technologies, AG, Neubiberg (DE)

( * ) Notice: Subject to any disclaimer, the term of this patent is extended or adjusted under 35 U.S.C. 154(b) by 87 days.

(21) Appl. No.: 11/224,301

(22) Filed: Sep. 13, 2005

(65) Prior Publication Data

US 2007/0057350 A1    Mar. 15, 2007

(51) Int. Cl.
*H01L 23/495* (2006.01)
(52) U.S. Cl. .............. 257/676; 257/672; 257/674; 257/690; 257/773; 257/776; 257/E23.037; 257/E23.04
(58) Field of Classification Search ........ 257/666–667, 257/E23.001–E23.194
See application file for complete search history.

(56) References Cited

U.S. PATENT DOCUMENTS 6,534,787 B1   3/2003   Sander et al.
7,095,099 B2 *   8/2006   Oliver et al. .............. 257/676
2003/0136968 A1 *   7/2003   Fjelstad .................... 257/82

FOREIGN PATENT DOCUMENTS

WO     WO98/21751     5/1998

* cited by examiner

*Primary Examiner*—Jasmine Clark
(74) *Attorney, Agent, or Firm*—Edell, Shapiro & Finnan, LLC

(57) ABSTRACT

A semiconductor component includes at least one semiconductor power switch, wherein a gate electrode and at least two source regions are disposed on the upper side of the semiconductor power switch. The component further includes a leadframe including a die pad and a number of leads disposed on one side of the die pad. A number of connectors extends between the source regions and the source leads such that each source lead is electrically connected to each source region.

23 Claims, 3 Drawing Sheets

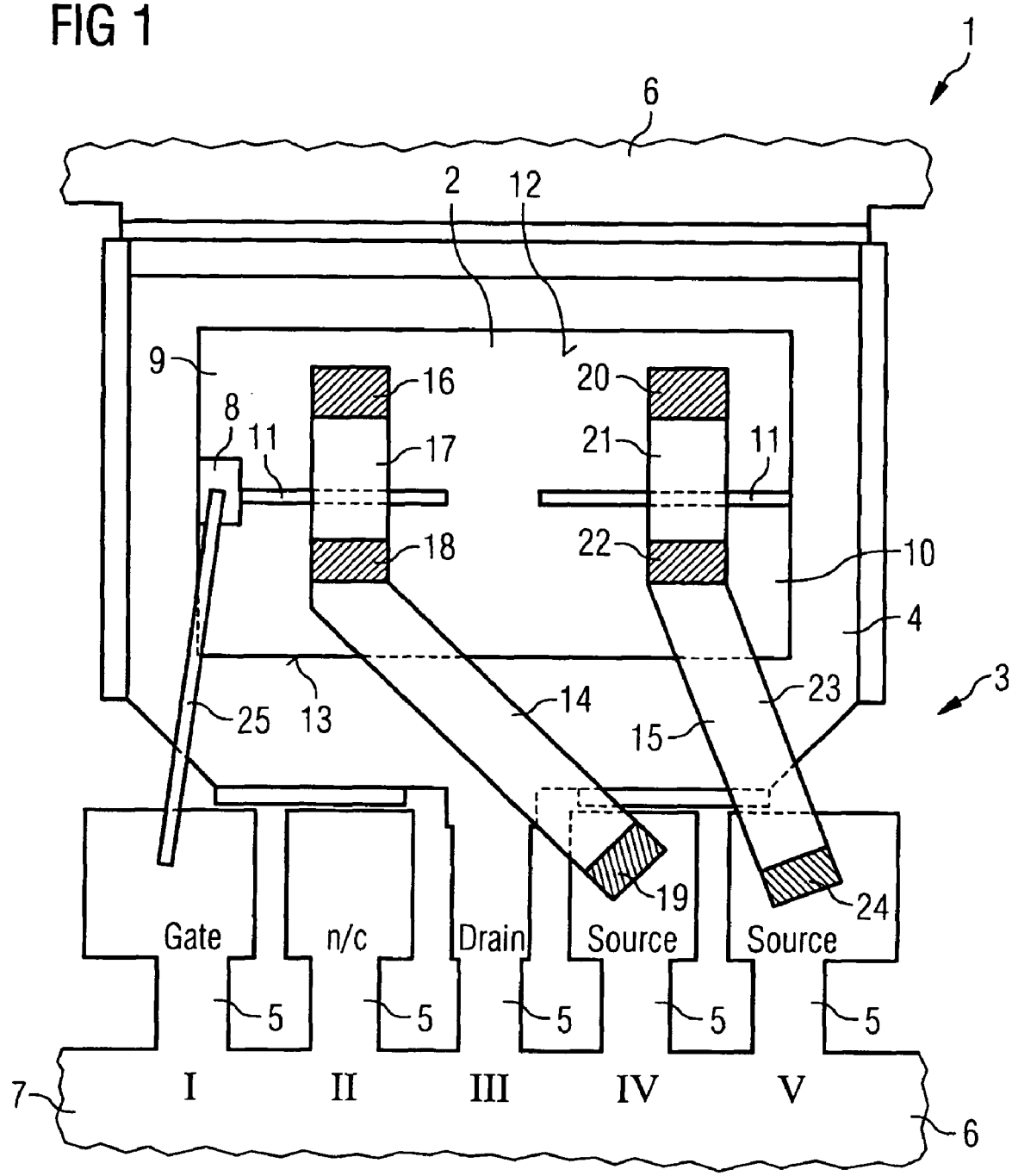

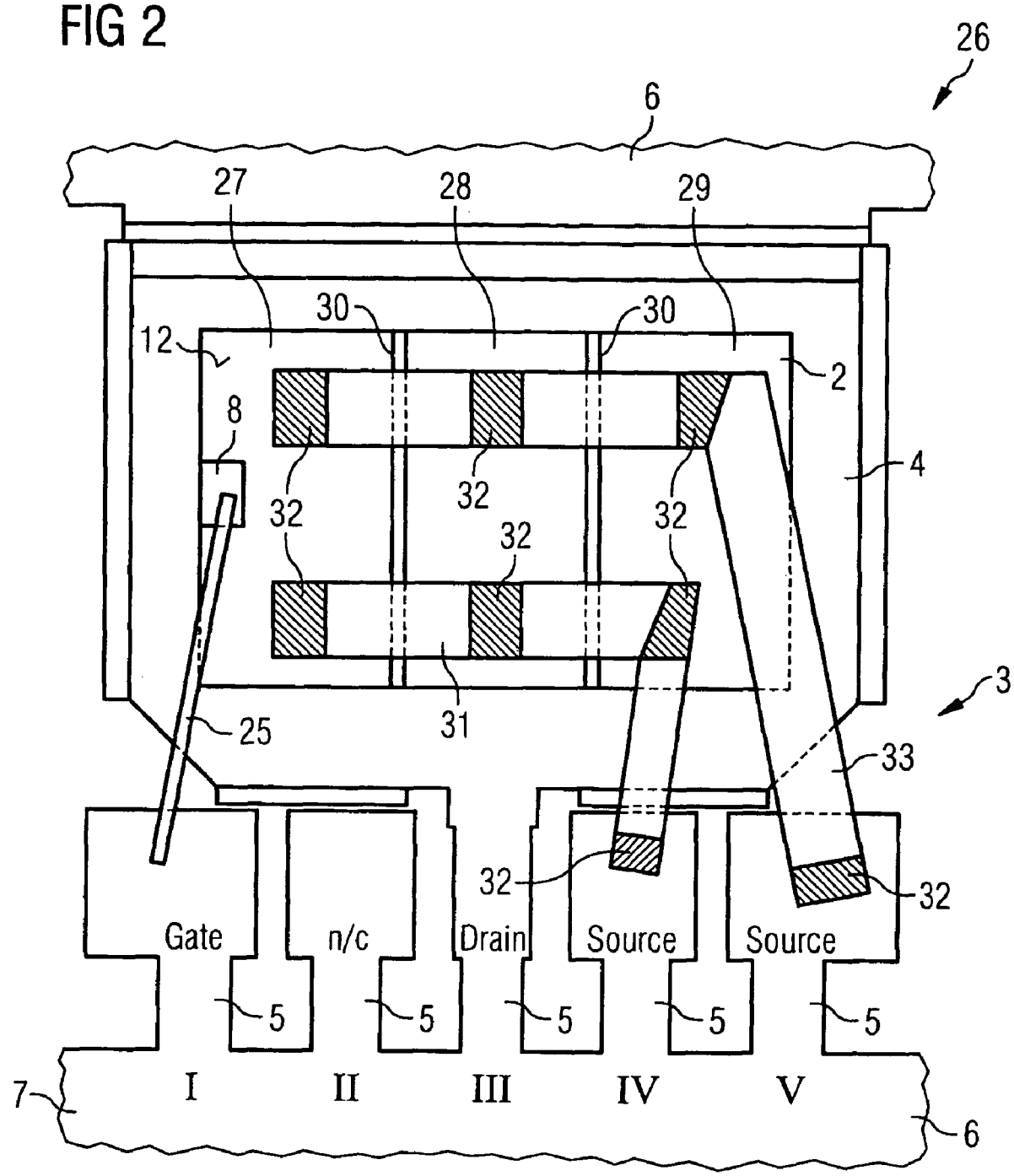

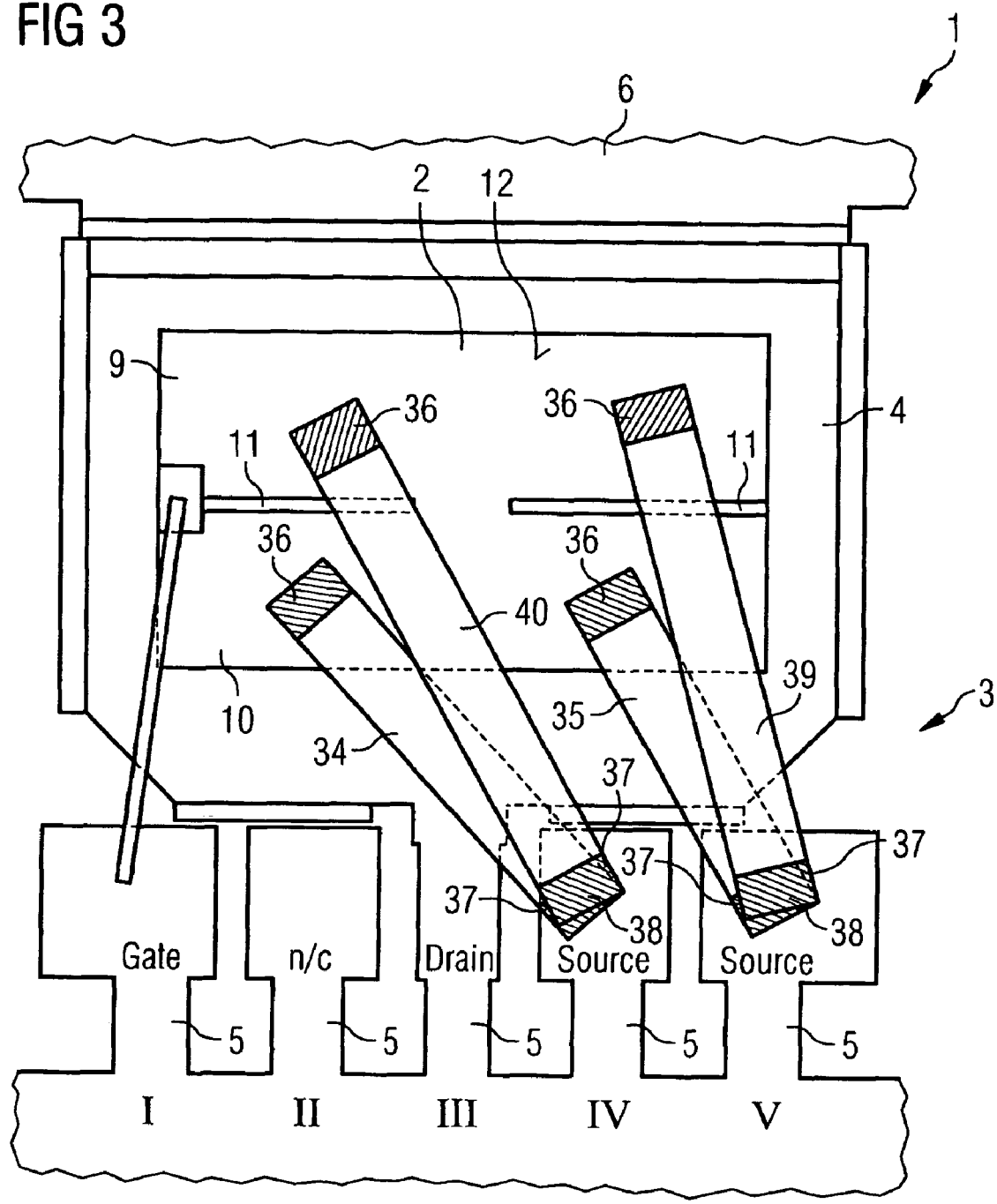

SEMICONDUCTOR COMPONENT AND METHOD OF ASSEMBLING THE SAME

FIELD OF THE INVENTION

The invention relates to a semiconductor component including a semiconductor power switch and to methods of assembling the semiconductor component.

BACKGROUND

A semiconductor power switch may be provided by a MOSFET or an IGBT which includes a large number of cell fields. In order to increase the power and increase the switching speed, two or more input connections to the semiconductor component and to the power switch within the component may be provided. As is described in U.S. Pat. No. 6,534,878, this can be provided by two power path pins or leads in the component, each of which is connected to a single power electrode on the semiconductor chip by a bond wire. Since the current is now divided between two bond wires connected in parallel, the bond wire resistance is effectively reduced so that the load current can be increased.

U.S. Pat. No. 6,534,878 also describes a component in which the power connection between the semiconductor chip and conductor frame of a semiconductor power switch is optimized by providing a symmetrical arrangement of the input contacts on the power switch and a symmetrical arrangement of the bonding connections from the input contacts to the conductor frame. The symmetrical arrangement provides two input bond wires which are of a similar length. This further improves the current distribution between the input paths and further reduces the bond wire resistance.

U.S. Pat. No. 6,534,878 also discloses an arrangement by which the interfacial contact area between a bond wire and its contact electrode is increased, which effectively reduces the length of the bond wire and provides a reduced on-state DC resistance and higher loadability.

However, these components can be unreliable, as the current distribution between the bond wires varies due to variations in the lengths of the bond wires.

SUMMARY OF THE INVENTION

The present invention provides a semiconductor component including a more reliable semiconductor power switch with a high switching speed and a method of assembling such a semiconductor component. The semiconductor component includes at least one semiconductor power switch and a leadframe. The semiconductor power switch comprises an upper side and a lower side. At least one gate electrode and at least two source regions are disposed on the upper side of the semiconductor power switch, and a drain electrode is disposed on the lower side of the semiconductor power switch. The source regions are at least partly disassociated from each other. The leadframe comprises a die pad and a plurality of leads which are disposed on one side of the die pad. Each lead has an inner portion and an outer portion. At least one lead extends from the die pad and provides a drain lead. The remaining leads of the plurality of leads are spaced at a distance from the die pad and provide at least one gate lead and at least two source leads. The outer portions of each of the leads of the leadframe extend in essentially parallel directions. The lower side of the semiconductor power switch is mounted on, and is electrically connected to, the die pad. The semiconductor component further comprises at least one first connector which extends between the gate electrode of the semiconductor power switch and the gate lead of the leadframe. The semiconductor component also comprises a plurality of second connectors which extend between the source regions and the source leads. According to the invention, each source lead is electrically connected to each source region.

The first connector which extends between the gate electrode of the semiconductor power switch and the gate lead provides the electrical connection between the gate electrode and the gate lead. The plurality of second connectors also electrically connect the source regions of the semiconductor power switch and the source leads of the leadframe.

In this specification, disassociated is used to denote regions of the semiconductor power switch in which the cell fields are partly separate from each other. The cell fields are disposed within a single common semiconductor body, which is frequently referred to as a semiconductor chip, but are electrically either indirectly connected or are essentially electrically isolated from each other. The source regions may also be physically separated by regions of the semiconductor body which do not include any cells.

In order to access each source region, each source region is electrically connected to the leadframe. In a standard component, each source region is electrically connected to only one source lead. This arrangement provides an unsymmetrical current distribution between the various disassociated source regions disposed in the semiconductor body.

In contrast, according to the invention, the source regions, which are at least partly disassociated from each other, are provided with an electrical connection to each of the source leads of the leadframe of the semiconductor component. Therefore, each source lead is electrically connected to each source region and each source region is electrically connected in parallel to the leadframe within the body of the semiconductor component.

The internal parallel connection provided by the invention has the advantage that each source region is connected to each source lead. Therefore, even if only one source lead is connected to the external power supply, all of the source regions of the semiconductor component electrically connected to the power supply and can be accessed. Therefore, the performance of the component remains largely unaffected when only one source lead is externally connected.

The parallel electrical connection within the component, which is provided by electrically connecting each source lead to each source region, also improves the performance of the component by improving the current distribution in a short circuit situation. Since the current is more symmetrically distributed to all of the source regions, damage is less likely to occur to the semiconductor switch.

According to an exemplary embodiment, each source lead is electrically connected to each source region by one, i.e., a single, second connector. The second connector extends between one source lead and each source region of the semiconductor power switch. This arrangement has the advantage that only one second connector is electrically connected with each source lead. This simplifies the connection process as the contact area provided on the innermost region of the source lead is limited. In this embodiment, each second connector includes a number of intermediate electrical connection points along its length as well as at the two free ends. At these intermediate points, the second connector is in mechanical contact with, and is electrically connected to, the source regions. At the portions of the second connector located between these intermediate points and the two free ends, the connector is electrically and mechanically isolated from the semiconductor power switch and the leadframe.

In another embodiment, each source lead is electrically connected to each source region by a plurality of second connectors. In this embodiment, each second connector extends directly between a source lead and a source region so that the two free ends of the second connector are mechanically connected and electrically connected to a source lead and a source region. The central portion of the connector located between the two electrically connected regions is electrically and mechanically isolated from the semiconductor power switch and the leadframe.

If, for example, there are two source regions, then four connections are provided. A connection is provided between each of the two source regions and a source lead. Therefore, two connections are provided on each source lead, each extending to one of the two source regions. Two connections are also provided in each source region, each connection extending to one of the two source leads. This arrangement has the advantage that standard connecting methods can be used to bond each of the free ends of the second connectors.

The first connector and the plurality of second connectors may comprise a plurality of bond wires or, alternatively, a plurality of leads. The leads may be provided by strips of a foil. Typically, the plurality of second connectors have a larger cross-sectional area than the first connector so as to reduce the electrical resistance of the power input path.

If each source lead is electrically connected to each source region by one second connector, the second connector may be provided by a bond wire. In this embodiment, if there are two source leads, then two second connectors are provided. Therefore, one of the plurality of bond wires may be connected to each source region by a stitch bond and to one source lead by a wedge bond. The source regions are, therefore, electrically connected by a series of stitch bonds, positioned along the length of the wire, which are separated by loops in the bond wire. This arrangement can be provided using known wire-bonding techniques and has the advantage that only one bond wire is connected to each source lead. This simplifies the process by which the bond wires are connected to the source leads.

If each a source lead is electrically connected to each source region by a plurality of bond wires, each bond wire may be connected to a source region by a wedge bond and the source lead by a wedge bond. Wedge bonds have the advantage that the bonding loop is smaller than that required by thermocompression bonding so that the height of the package can be reduced. Furthermore, it is often desired that the bond wires have a relatively large cross-sectional area in order to reduce the electrical resistance. Bond wires with a large cross-sectional area are more easily bonded by wedge bonding techniques. In this context, a large cross-sectional area is used to describe bond wires with a diameter of 200 to 700 μm.

The wedge bond of one of the plurality of second bond wires may be disposed on the wedge bond of a second of the plurality of bond wires. The second of the plurality of bond wires is disposed directly on the source lead. Therefore, two or more bond wires are electrically connected to a single source lead by stacking the wedge bond of a second bond wire on the wedge bond of a first bond wire. This vertical stacking of the wedge bonds enables a plurality of bond wires to be connected to a single source lead which has a limited lateral contact area.

In another embodiment, the source regions disposed on the upper side of the power switch are partly disassociated from each other by one or more gate fingers also disposed in the upper side of the semiconductor power switch. In an alternative embodiment, the source regions are completely disassociated from each other. The source regions may be completely disassociated from each other by one or more gate fingers.

The semiconductor power switch may be a MOSFET (Metal Oxide Semiconductor Field Effect Transistor) or a IGBT (Isolated Gate Bipolar Transistor) device. Both of these types of semiconductor power switches comprise a plurality of cell fields and, therefore, are frequently provided with two or more at least partly disassociated source regions in order to increase the switching speed and improve the performance of the component.

In the description, the semiconductor power switch is described as having at least one source electrode, at least one drain electrode and at least one gate electrode as is used for MOSFET switches. However, this nomenclature is not intended to limit the semiconductor power switch to a MOSFET. For other types of semiconductor power switch, this nomenclature refers to the corresponding feature. For a IGBT, source, therefore, corresponds to emitter and drain corresponds to collector.

The semiconductor component may also further comprise plastic housing material which forms the component housing. The plastic housing or encapsulation material encapsulates the semiconductor power switch, the plurality of first connectors, the plurality of second connectors and the inner portions of the leads of the leadframes. The outer portions of the leads extend outside of the component housing and provide the external contact areas of the component which enable the component to be mounted on a higher-level substrate such as a printed circuit board and be connected to external circuitry.

The component housing may have a standard package outline such as TO-type package outline. The outer portions of the leads of the leadframe may have also dimensions and an arrangement which corresponds to a standard component outline. This has the advantage that the component can be fitted into existing applications modification of the mounting arrangement or printed circuit board, for example. The improved performance and protection against damage caused by short circuits is provided internally, i.e., by the improvements to the electrical connection arrangement within the package, so that the customer or user of the component according to the invention does not necessarily need to modify the board.

The internal parallel arrangements between multiple source regions and multiple source leads may also be used in modules which include two or more semiconductor power switches.

The invention also relates to methods of assembling a semiconductor components. At least one semiconductor power switch which comprises an upper side and a lower side is provided. The semiconductor power switch comprises a gate electrode and at least two source regions which are disposed on the upper side of the semiconductor power switch. The source regions are at least partly disassociated. The semiconductor power switch further comprises a drain electrode which is disposed on the lower side of the semiconductor power switch.

A leadframe is also provided which comprises a die pad and a plurality of leads disposed on one side of the die pad. Each lead has an inner portion and an outer portion. The outer portions of the plurality of leads extend in essentially parallel directions. At least one lead extends from the die pad and provides a drain lead. The remaining leads are spaced at a distance from the die pad and provide at least one gate lead and at least two source leads. The lower side of the semiconductor power switch, which includes the drain electrode, is mounted on and electrically connected to the die pad.

At least one first connection is then produced which extends between and electrically connects the gate electrode disposed on the upper side of the semiconductor power switch and the gate lead of the leadframe. Each first connection is provided by a first connector. A plurality of second connections are also produced. Each second connection is provided by a second connector. The second connections extend between and electrically connect the source regions and the source leads and are produced. The second connectors are produced so that each source lead is electrically connected to each source region.

This assembly method can be simply integrated into an existing manufacturing line as it requires only a modification of the electrical connection step in which the gate electrode and source regions are electrically connected to the corresponding leads of the leadframe. The plurality of second connections are provided, according to the invention, so that each source lead of the leadframe is electrically connected to each source region.

The lower side of the semiconductor power switch may be mounted on and electrically connected to the die pad by soft solder or by a diffusion soldering technique. Diffusion soldering has the advantage that the intermetallic phases of the bond produced have a higher melting point than the temperature at which the bond was produced. Therefore, the bond is stable during subsequent processing steps and, in particular, subsequent soft soldering processes.

The first connections and second connections between the semiconductor power switch and the leads of the leadframe may be produced by bond wires or by leads.

In an exemplary embodiment of the invention, a second connection is produced which extends between and electrically connects each source region of the semiconductor power switch and one source lead. Therefore, if the semiconductor component comprises two source leads, two second connections are provided, each second connection being electrically connected to each source region and to one of the two source leads.

In a further embodiment of the invention, each source lead is electrically connected to each source region by a plurality of second connections. In this embodiment, a second connection extends directly between a source region and a source lead. Therefore, if the semiconductor power switch has two source regions, each source region is connected by a second connection to each source lead. Therefore, two second connections are attached to each of the two source leads, each connection extending to a different source region.

If the source lead is connected to each source region by a plurality of bond wires, in one embodiment, a bond wire is formed which extends between a first source region and a source lead. The bond wire is connected at each of its free ends to the source region and source lead respectively. A second source region is connected to the same source lead by a further bond wire. The further bond wire is connected at one end by a wedge bond to the second source region on the semiconductor power switch. Its opposing free end is connected by a second wedge bond to the source lead by connecting the second wedge bond to the wedge bond already disposed on the source lead. The source lead, therefore, includes a stack of wedge bonds. This method has the advantage that standard connection methods can be used as each of the free ends of the connection is connected to either a source region or a source lead.

In another embodiment, one second bond wire is connected to each of the source regions by a stitch bond and to one source lead by a wedge bond. In this embodiment, only one wedge bond is positioned on each source lead. The second bond wire, therefore, comprises a series of stitch bonds positioned at intervals along its length which are linked together by loop in the bond wire. This provides a single conducting path which is electrically connected with the source regions and the source leads at the electrical connection points provided by the stitch bonds and wedge bond.

The method of assembling a semiconductor component may further include providing a plastic housing material which forms the component housing. The semiconductor power switch, the plurality of first connectors, the plurality of second connectors, and the inner portions of the leads are encapsulated in the plastic housing material. This process can be carried out using a transfer mold process.

The invention provides a bonding arrangement which is particularly is suitable for power a semiconductor packages, such as for example a power MOSFET, which comprises two or more source regions which are separated by, for example, gate fingers. This arrangement of source regions and gate fingers increases in the switching speed and improves the accessing of the individual MOSFET cells. Although the switching speed is increased by this arrangement, the contacting is more complicated as the partly or completely disassociated source regions have to be provided with current.

The semiconductor component according to the invention has the advantage that the source regions are provided with a parallel source contact arrangement within the package housing. This arrangement provides compensation for an even or unsymmetrical current distribution between the source regions due to the screening effect of the gate fingers within the package itself. Therefore, a more reliable component can be provided for the customer or user.

BRIEF DESCRIPTION OF THE DRAWINGS

Embodiments of the invention will now be described with reference to the diagrams.

FIG. 1 shows a plan view of a semiconductor component which includes two partly dissociated source regions according to a first embodiment of the invention;

FIG. 2 illustrates a plan view of a semiconductor component with three completely disassociated source regions according to a second embodiment of the invention; and FIG. 3 shows an alternative contacting arrangement of the semiconductor component of FIG. 1, according to a third embodiment of the invention.

DETAILED DESCRIPTION

FIG. 1 illustrates a semiconductor component 1 according to a first embodiment of the invention. FIG. 1 shows a plan view of the semiconductor component 1 which includes a semiconductor device 2 and a leadframe 3. FIG. 1 illustrates the internal bonding arrangement of the semiconductor component 1.

The semiconductor device 2 is a semiconductor MOSFET device 2. The leadframe 3 comprises a die pad 4 and five leads 5. The die pad 4 is essentially laterally rectangular and has two long sides and two short sides. The five leads 5 are positioned adjacent one long side of the die pad 4 and extend in directions approximately perpendicular to the long side of the die pad 4 and, therefore, essentially parallel to one another. The leads 5 each have an inner portion and an outer portion. The inner portion of each of the leads 5 is horizontally, in the orientation shown in FIG. 1, slightly enlarged to provide a large inner contact area. The central lead, labeled in FIG. 1 as III, extends from the die pad 4 and is, therefore, electrically as well as mechanically connected to the die pad 4. Lead III provides the drain lead of the component 1.

The remaining leads 5, labeled in FIG. 1 as I, II, IV, and V, are positioned so that the innermost edge of the lead 5 lies at a short distance from the edge of the die pad 4. These remaining leads are linked by a support structure 6 in a leadframe strip 7 which includes a plurality of leadframes, essentially the same as that shown in FIG. 1. The support structure 6 will be removed after the assembly and encapsulation process of the semiconductor components is complete.

In this embodiment of the invention, the semiconductor component 1 includes two source leads, labeled as IV and V in FIG. 1, and one gate lead, labeled I. The lead labeled II is not connected in this embodiment of the invention.

The MOSFET device 2 is a vertical device. The upper surface 12 of the MOSFET device 2 comprises a gate electrode 8 and two source regions 9 and 10 fabricated within the upper surface of the body of the semiconductor device 2. The lower surface 13 of the MOSFET device comprises the drain electrode of the MOSFET device, which cannot be seen in the top plan view. The lower surface 13 is mounted on and electrically connected to the die pad 4 and, therefore, the drain lead labeled III.

The MOSFET device 2 is laterally essentially rectangular and has two long sides and two short sides and is mounted essentially concentrically on the rectangular die pad 4. The plurality of leads 5, therefore, lie adjacent a long side of the MOSFET device 2. The two source regions 9 and 10 each comprise a plurality of transistor cells forming a cell field. The two source regions 9 and 10 are partly disassociated from each other by two gate fingers 11. A gate finger 11 protrudes from approximately the center of each of two opposing short walls of the MOSFET device 2 and extends towards the lateral center of the upper surface of the MOSFET device 2. The two gate fingers 11 are separated by a small distance and, therefore, provide two partly disassociated source regions 9 and 10 within the single body of the MOSFET device 2.

The source region 9 and source region 10 are electrically connected by a single bond wire 14 to the source lead IV. The source region 9 and source region 10 are also electrically connected by a second bond wire 15 to the second source lead V.

The first bond wire 14 is mechanically and electrically connected to a first region of the source region 9 by a stitch bond 16 which is positioned at the free end of the bond wire 14. The bond wire 14 extends from the stitch bond 16 via a loop 17 to a first position of the second source region 10 to which it is mechanically and electrically attached by a further stitch bond 18.

The bond wire 14 extends from the stitch bond 18 to the inner portion of the source lead to which it is attached by a wedge bond 19. The bond wire 14 remains electrically isolated from the gate finger 11 as the loop 17, which is positioned between the two regions 16 and 18 which are electrically connected to the first source region 9 and the second source region 10 respectively, is raised above the surface 12 of the MOSFET device 2.

Similarly, a first end of the bond wire 15 is electrically connected to a second region, which is different from the first region, of the source region 9 by a stitch bond 20. The bond wire 15 extends from the stitch bond 20 via a loop 21 and is electrically connected by a further stitch bond 22 to a second position, which is different from the first position, of the second source region 10 and by a further loop 23 to the source lead V. This second end of the bond wire 15 is electrically connected to the inner portion of the source lead 5 by a wedge bond 24. The positions of the interface between the bond positions 16, 18, 19, 20, 22 and 24 of the bond wires 14 and 15, which are mechanically and electrically attached to the source regions 9 and 10 and source leads 5, are indicated by a hatched area. The remaining portions of the bond wires 14, 15 are not in contact with the MOSFET device 2 or the leadframe 3.

In this embodiment of the invention, source lead IV is connected by a single bond wire 14 to both of the two source regions 9 and 10 located on the upper side of the MOSFET device 2. The source lead V is electrically connected to both of the source regions 9 and 10 by a single bond wire 15.

This arrangement has the advantage that the two source regions 9, 10 can be accessed by a single source lead 5. Therefore, if only one source lead is connected to an external power supply, the switching speed of the component 1 is not reduced. Also, in the case of a short circuit, the current is better distributed since each region is connected to two source leads.

The bond wires 14 and 15 which electrically connect the two source regions 9, 10 to the source leads IV, V comprise aluminum and have a diameter of approximately 500 µm. The gate electrode 8 is electrically connected to the gate lead I by a bond wire 25 which has a diameter of approximately 30 µm and comprises gold.

FIG. 2 shows a plan view of a semiconductor component 26 according to a second embodiment of the invention. Parts of the component which are essentially the same as those shown in FIG. 1 are denoted by the same reference numerals and are not necessarily described again. FIG. 2 illustrates that the bonding arrangement as shown in FIG. 1 can be used for devices with three or more source regions.

In this embodiment of the invention, the MOSFET device 2 includes three source regions 27, 28, and 29 disposed in the body of the MOSFET device 2. The three source regions 27, 28, 29 are completely disassociated from each other by two gate fingers 30 which extend in a direction parallel to the leads 5 of the component 26. In this embodiment, the gate fingers 30 extend across the full extent of the upper surface 12.

Each of the source regions 27, 28, 29 is electrically connected by a bond wire 31, 33 to each of the two source leads, labeled IV and V, of the component 26. A first bond wire 31 is connected by stitch bonds 32 positioned along the length of the bond wire 31 to the three source regions 27, 28, and 29 and by a wedge bond positioned at the free end of the bond wire 31 to the source lead, labeled IV. The first bond wire 31 extends approximately horizontally across the MOSFET device 2, in the orientation shown in FIG. 2 with loop in the bond wire at the positions at which the bond wire 31 reaches over the gate fingers 30. The bond wire 31 is, therefore, electrically isolated from the gate fingers 30.

Similarly, a second bond wire 33 extends between and electrically connects the three source regions 27, 28, and 29 to the second source lead, labeled V. Therefore, each of the source regions 27, 28, and 29 is electrically connected to and can be accessed by each source lead independently.

FIG. 3 shows an alternative arrangement of the bonding wires for a MOSFET device 2 as shown in FIG. 1. Parts of the component which are essentially the same as those shown in FIG. 1 are denoted by the same reference numerals and are not necessarily described again.

The MOSFET device 2 comprises two partly disassociated regions 9 and 10 in its upper surface 12. In contrast to the embodiment of FIG. 1, each source lead is connected to the two source regions 9, 10 by two bond wires rather than by a single bond wire. Therefore, similarly to the alternative arrangement of the bonding wires shown in FIG. 1, a parallel bonding arrangement is provided within the housing of the semiconductor component 1.

The source lead IV is electrically connected by a bond wire 34 to the source region 10. In this embodiment of the invention, the two free ends 36 and 37 of the bond wire 34 are connected to the source region 10 and source lead IV, respectively. The source lead IV is electrically connected to the source region 9 by a second bond wire 40 which extends between the source region 9 and source lead IV.

In this embodiment, of the invention, the second end 37 of the bond wire 34 is electrically connected to the source lead IV by a wedge bond indicated by the hatched area 38. The bond wire 40 is electrically connected to the source lead IV by producing a wedge bond at its free end 37 so that the wedge bond of the bond wire 40 is attached to the top of the wedge bond connecting the bond wire 34 to the source lead IV.

In a similar fashion, the source lead V is also electrically connected to the source region 10 by a second bond wire 35. The two free ends 36 and 37 of the bond wire 35 are respectively electrically connected to the source region 10 and source lead labeled V.

Similarly source region 9 is electrically connected by a bond wire 39 which extends between the source region 9 and the second source lead V. The second end 37 of the bond wire 39 is also electrically connected to the source lead V by a wedge bond indicated by the hatched area 38. The wedge bond of the bond wire 39 is positioned on top of the wedge bond of the bond wire 35 in order to electrically connect the source region 9 to the source lead V.

Therefore, in order to fabricate the bonding arrangement seen in FIG. 3, a conventional wire bonding tool may be used to form the wedge bonds. Firstly, a bond connection is formed between source region 10 and the source lead IV by a bond wire 34. The source region 10 is then electrically connected by bond wire 35 which reaches between a second point in the source region 10 and the source lead V. In each case, the bond wires 34 and 35 are formed by producing a wedge bond at the desired point on the source region 10, spooling the wire from a wire source, until the bonding tool is positioned over that the respective source lead. A wedge bond is then formed between the bonding wire and a source lead, after which, the source wire is clamped by the bonding tool and the bonding tool is moved away from the leadframe 3, severing the bond wire 34 from the wire spool. For thicker bond wires, the wire 34 may be cut at the interface between the wedge bond 38 and the wire spool.

In a second step, bond wires 40 and 39 are formed. Firstly, a wedge bond is formed at the free end 36 of the wire 40 at a first point in source region 9. The bonding tool is moved upwards and away from the upper surface 12 of the MOSFET device 2 until it is positioned over the wedge bond 38 already positioned on the source lead IV. The bonding tool is then brought down, and a second wedge bond 38 formed on top of the wedge bond already positioned on the source lead IV. The source region 9 is, therefore, electrically connected by the bond wire 40 and the two wedge bonds 38 to the source lead IV.

Similarly, a second bond wire 39 is produced between a second region within the source region 9 and the wedge bond 38 positioned on the second source lead V.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

REFERENCE NUMBERS 1 semiconductor component
2 MOSFET device
3 leadframe
4 die pad
5 lead
6 support structure
7 leadframe strip
8 gate electrode and
9 first source region
10 second source region
11 gate finger
12 upper surface of MOSFET
13 lower surface of MOSFET
14 first bond wire
15 second bond wire
16 stitch bond
17 loop
18 stitch bond
19 wedge bond
20 stitch bond
21 loop
22 stitch bond
23 loop
24 wedge bond
25 bond wire
26 second semiconductor component
27 source region
28 source region
29 source region
30 gate finger
31 first bond wire
32 bonding points
33 second bond wire
34 first bond wire
35 first bond wire
36 first end
37 second end
38 wedge bond
39 second bond wire
40 second bond wire

What is claimed is:

1. A semiconductor component, comprising:

at least one semiconductor power switch comprising an upper side and a lower side, wherein a gate electrode and at least two source regions are disposed on the upper side of the semiconductor power switch, the source regions being at least partly disassociated, and wherein a drain electrode is disposed on the lower side of the semiconductor power switch;

a leadframe comprising a die pad and a plurality of leads disposed on one side of the die pad, each lead having an inner portion and an outer portion, wherein at least one lead extends from the die pad and provides a drain lead and the remaining leads are spaced at a distance from the die pad and provide at least one gate lead and at least two source leads, and wherein the lower side of the semiconductor power switch is mounted on and electrically connected to the die pad;

at least one first connector extending between the gate electrode of the semiconductor power switch and the gate lead of the leadframe; and a plurality of second connectors extending between the source regions and the source leads, wherein each source lead is electrically connected to each source region.

2. The semiconductor component according to claim 1, wherein each source lead is electrically connected to each source region by one second connector that extends between one source lead and each source region of the semiconductor power switch.

3. The semiconductor component according to claim 2, wherein the plurality of second connectors comprise a plurality of bond wires, each of the bond wires being connected to each source region by a stitch bond and to one source lead by a wedge bond.

4. The semiconductor component according to claim 1, wherein each source lead is electrically connected to each source region by a plurality of second connectors, each second connector extending directly between a source lead and a source region.

5. The semiconductor component according to claim 4, wherein the plurality of second connectors comprises a plurality of bond wires, each of the bond wires being connected to the source region by a wedge bond and to the source lead by a wedge bond.

6. The semiconductor component according to claim 5, wherein the wedge bond of one of the plurality of second bond wires is disposed on the wedge bond of a second of the plurality of second bond wires, the second of the plurality of second bond wires being disposed on the source lead.

7. The semiconductor component according to claim 1, wherein the first connector and the plurality of second connectors comprise one of a plurality of bond wires and a plurality of leads.

8. The semiconductor component according to claim 1, wherein the source regions are partly disassociated from each other by one or more gate fingers.

9. The semiconductor component according to claim 1, wherein the source regions are completely disassociated from each other.

10. The semiconductor component according to claim 9, wherein the source regions are completely disassociated from each other by one or more gate fingers.

11. The semiconductor component according to claim 1, wherein the semiconductor power switch is a MOSFET or an IGBT.

12. The semiconductor component according to claim 1, wherein the component further comprises:
plastic housing material forming a component housing, the plastic housing material encapsulating the semiconductor power switch, the at least one first connector, the plurality of second connectors, and the inner portions of the leads.

13. The semiconductor component according to claim 12, wherein the component housing has a TO-type outline.

14. A method of assembling a semiconductor component, comprising:
providing at least one semiconductor power switch comprising an upper side and a lower side, wherein a gate electrode and at least two source regions are disposed on the upper side of the semiconductor power switch, wherein the two source regions are at least partly disassociated, and wherein a drain electrode is disposed on the lower side of the semiconductor power switch;
providing a leadframe comprising a die pad and a plurality of leads disposed on one side of the die pad, each lead having an inner portion and an outer portion, wherein at least one lead extends from the die pad and provides a drain lead, and the remaining leads are spaced at a distance from the die pad and provide at least one gate lead and at least two source leads;
mounting and electrically connecting the lower side of the semiconductor power switch on the die pad;
producing at least one first connection extending between the gate electrode of the semiconductor power switch and a gate lead of the leadframe; and
producing a plurality of second connections, the second connections extending between the source regions and the source leads so that each source lead is electrically connected to each source region.

15. The method of assembling a semiconductor component according to claim 14, wherein each of the second connections extends between and electrically connects each source region of the semiconductor power switch and one source lead.

16. The method of assembling a semiconductor component according to claim 15, wherein the plurality of second connections comprises a plurality of bond wires and each bond wire is connected to each of the source regions by a stitch bond and to one source lead by a wedge bond.

17. The method of assembling a semiconductor component according to claim 14, wherein each source lead is electrically connected to each source region by a plurality of second connections, each second connection extending directly between a source region and a source lead.

18. The method of assembling a semiconductor component according to claim 17, wherein the plurality of second connections comprises a plurality of bond wires and each bond wire is connected to one of the source regions by a wedge bond and to one of the source leads by a wedge bond.

19. The method of assembling a semiconductor component according to claim 18, wherein the wedge bond of one bond wire is attached to the source lead and the wedge bond of another bond wire is attached to the wedge bond of said one bond wire.

20. The method of assembling a semiconductor component according to claim 14, wherein the first connections and second connections are produced by one of bond wires and leads.

21. The method of assembling a semiconductor component according to claim 14, further comprising:
encapsulating the semiconductor power switch, the plurality of first connections, the plurality of second connections, and the inner portions of the leads in a plastic housing material, the plastic housing material forming the component housing.

22. The semiconductor component of claim 1, wherein the source regions are electrically isolated from each other.

23. The semiconductor component of claim 1, wherein each source region comprises a cell field, and the source regions are physically separated from each other by at least one region that does not include any cell field.

* * * * *